United States Patent [19]
Yoshikawa et al.

[11] Patent Number: 4,556,871
[45] Date of Patent: Dec. 3, 1985

[54] TOUCH SENSING DEVICE

[75] Inventors: Kazuo Yoshikawa, Kawasaki; Hisashi Yamaguchi, Atsugi; Toru Asano, Kawasaki, all of Japan

[73] Assignee: Fujitsu Limited, Kawasaki, Japan

[21] Appl. No.: 505,979

[22] Filed: Jun. 20, 1983

[30] Foreign Application Priority Data

Jun. 18, 1982 [JP] Japan ................. 57-105665

[51] Int. Cl.$^4$ .............................................. G06F 3/02
[52] U.S. Cl. .................... 340/365 C; 200/DIG. 1; 340/365 S
[58] Field of Search ............ 340/365 C, 365 S, 365 E, 340/712; 200/DIG. 1; 307/116; 400/479.1

[56] References Cited

U.S. PATENT DOCUMENTS

| | | | |
|---|---|---|---|
| 3,594,781 | 7/1971 | Gerjets | 340/365 S |
| 4,291,303 | 9/1981 | Cutler | 340/365 C |
| 4,405,917 | 9/1983 | Chai | 340/365 S |

FOREIGN PATENT DOCUMENTS 0078676 10/1982 Japan .

OTHER PUBLICATIONS

*IEEE International Solid State Circuits Conference,* Katz, Session XV, Feb. 17, 1978, pp. 202-203.

*Primary Examiner*—James J. Groody
*Attorney, Agent, or Firm*—Staas & Halsey

[57] ABSTRACT

A transparent finger touch sensing device having a sensing circuit including a resonator for sensing a touch an oscillator for supplying an AC signal to the resonator, a buffer circuit for isolating an output of the oscillator from each selected touch electrodes and for supplying the oscillator output to the remaining non-selected touch electrodes when the sensing circuit is sequentially connected to the touch sensing electrodes, is disclosed. Thereby, the selected touch electrodes and non-selected touch electrodes are maintained at a voltage having the same phase and the same level and the inter-electrode impedance is substantially negligible.

5 Claims, 3 Drawing Figures

TOUCH SENSING DEVICE

BACKGROUND OF THE INVENTION

1. Field of the Invention

This invention relates to an improvement in a see-through type finger touch sensing device which is provided on a display screen and is used for inputting the data designated by the area touched on the screen by a finger into a computer system.

2. Description of the Prior Art

A see-through type touch keyboard is well known as a man-machine interface unit which is mounted on the display screen of display unit and is used for inputting the data designated by the area touched on the screen into a computer system. For a touch keyboard of this kind, it is important to accurately detect the touch condition. Various systems have been proposed to achieve the required accuracy. One such sensing system measures the change of capacitance between touch sensing electrode and ground induced by a finger touch utilizing the resonant phenomenon of a resonant circuit. This method is explained in detail in the U.S. patent application Ser. No. 437,220 filed Oct. 28, 1982 assigned to the same assignee as this invention.

The touch sensing system utilizing this resonant circuit is advantageous because a touch condition can be detected with a large ON-OFF ratio but, has disadvantage that errorneous operation is caused by contamination of the touch panel surface. Moreover, when a large scale touch panel is used, the capacitance between adjacent electrodes increases and thereby detection sensitivity is decreased.

SUMMARY OF THE INVENTION

The primary object of this invention is to provide an electrostatic capacitance detection type touch sensing device capable of preventing erroneous sensing of a touch condition due to moisture and contamination of the touch panel surface.

It is another object of this invention to realize a highly reliable touch sensing apparatus.

It is still another object of this invention to realize a highly sensitive detecting apparatus in a large scale touch panel.

Briefly, in order to attain the objects mentioned above, a touch sensing device according to this invention comprises a plurality of touch sensing electrodes positioned at perscribed locations to be sensed, a touch sensing circuit to which pertaining touch sensing electrodes are sequentially and selectively connected, the touch sensing circuit includes an oscillation circuit which supplies an AC signal to a selected touch sensing electrode, a buffer circuit which isolates the AC signal of an output of the oscillation circuit from the selected touch sensing electrodes and applies the AC signal to the non-selected touch electrodes so that the impedance between the non-selected touch sensing electrodes and the selected touch sensing electrode is substantially negligible.

PREFERRED EMBODIMENT OF THE INVENTION

Figure 1:
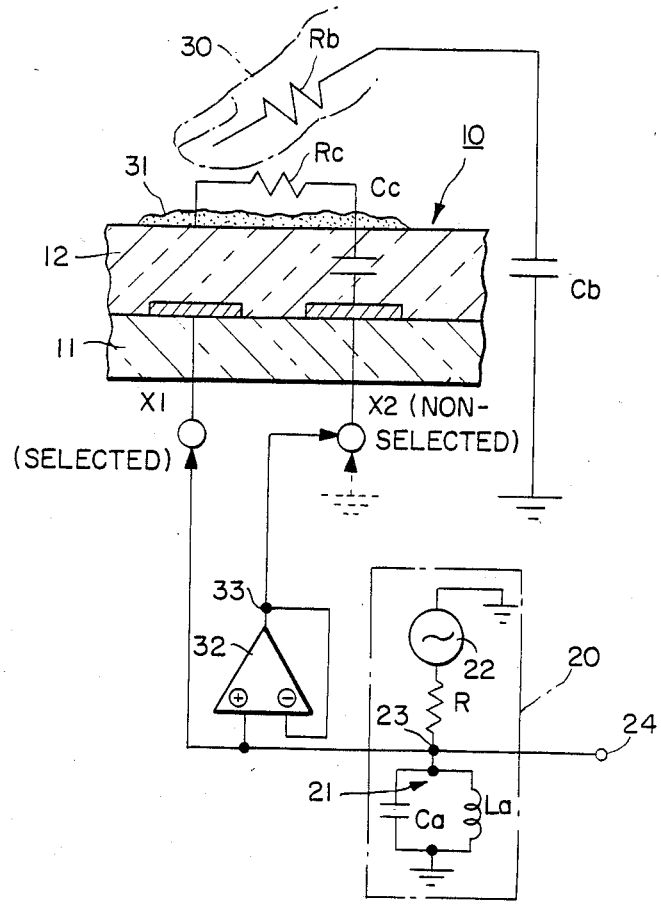
FIG. 1 is a block diagram of a touch sensing device embodying the present invention.

The operation of this invention will be explained with reference to FIG. 1.

A touch panel 10 comprises a pair of transparent touch sensing electrodes X1 and X2 adjacently arranged on a transparent substrate 11, and a cover comprising a transparent insulation film 12 placed thereon. When the touch electrode X1 is selected, a sensing circuit 20 is connected to the pertinent touch electrode. This sensing circuit 20 includes a parallel resonance circuit 21 of inductance La and capacitance Ca, AC oscillator 22 and resistance element R which connects the oscillator output to the resonator 21. The resonator 21 is usually designed to have a resonant characteristic tuned to the frequency of an oscillator 22, for example, to 12.5 kHz and to have maximum impedance (ideally, infinity) under this resonant condition. Therefore, if the touch electrode X1 is not touched when the touch electrode X1 is selected as explained above, an off signal level, being substantially equivalent to the output of oscillator 22, appears at an output terminal 24 connected to a connecting point 23. On the other hand, if there is a finger 30 touching the electrode X1 when it is selected, a resistance Rb and a capacitance Cb of the body are connected to the selected touch electrode X1. Therefore, the resonant condition resonator 21 is destroyed and a signal level at the connecting point 23, namely of the output terminal 24 drops to the level of ON state. The sensing operation becomes reliable as the ratio between the OFF state signal level and ON state signal level is large.

If a contamination substance 31 such as water or sweat exists over the touch electrodes X1 and X2 as shown in FIG. 1, then the substance 31 bridges over the selected electrodes X1 and non-selected electrode X2 with an equivalent resistance $R_c$. In this case, if the non-selected electrode is clamped (indicated by a dotted line) to the ground as is the case in existing selection methods, an inductive interference due to the capacitance between the adjacent electrodes can be prevented, but simultaneously a new problem is generated. Namely, the route extending to the non-selected electrode X2 passing through both the equivalent resistance Rc of the contamination substance and the equivalent capacitance Cc of the insulation film affects the selected electrode X1 in a manner similar to that created by the route created by the finger touching electrode X1 and connecting a resistance Rb and capacitance Cb of the human body to the electrode X1. As a result, a pseudo-touch condition may be sensed, even if there is no finger touching the panel.

This invention is intended to prevent the errorneous operation resulting from conductive contamination substances existing on the surface of the touch panel, as described above, and is based on a basic principle that non-selected touch sensing electrodes are clamped substantially to a voltage in the same phase and at the same level as that of the selected touch sensing electrodes. In order to realize such a clamp system, an output of the oscillator 22 is supplied from the connecting point 23 to the non-selected electrode X2 through a buffer circuit 32 for separation as shown in FIG. 1. The buffer circuit 32 comprises a voltage follower type operational amplifier and provides a structure of a non-inverting type amplifier having a high input impedance and low output impedance characteristic wherein a voltage gain is adjusted to almost 1 by connecting the minus input terminal (−) to an output terminal 33.

Thus, a voltage waveform at the output point 33 of the buffer circuit 32 has substantially the same phase and same level, following the input voltage waveform; that is, the signal at the connecting point 23. As a result, the selected touch sensing electrode X1 and adjacent non-selected touch sensing electrode X2 are sustained substantially at the same signal voltage, and accordingly impedance between these selected and non-selected electrodes can be substantially negligible. Therefore, erroneous operation is presented, even if moisture or conductive contamination adheres to the surface of the touch panel.

On the other hand, in a touch sensing device of this kind, if the panel increases in size, electrode capacitance between the selected touch electrode and remaining non-selected touch electrodes becomes large. If the non-selected touch electrode is clamped to ground, as in the case of the existing system, above the above-mentioned inter-electrode capacitance is connected in parallel with the resonator 21. Therefore, there is a problem that the capacitance between the selected and non-selected electrodes becomes high. Thus, the relative magnitude of the change of touch electrode capacitance due to the capacitance of a human body (e.g. a finger) is reduced, resulting in reduced detecting sensitivity. However, according to this invention concerning this point, both the selected and non-selected electrodes are maintained at the same potential, and therefore the inter-electrode capacitance can be neglected. Thus, the problem of preventing deterioration in detecting sensitivity due to an increase in the size of a panel is effectively solved.

Figure 2:
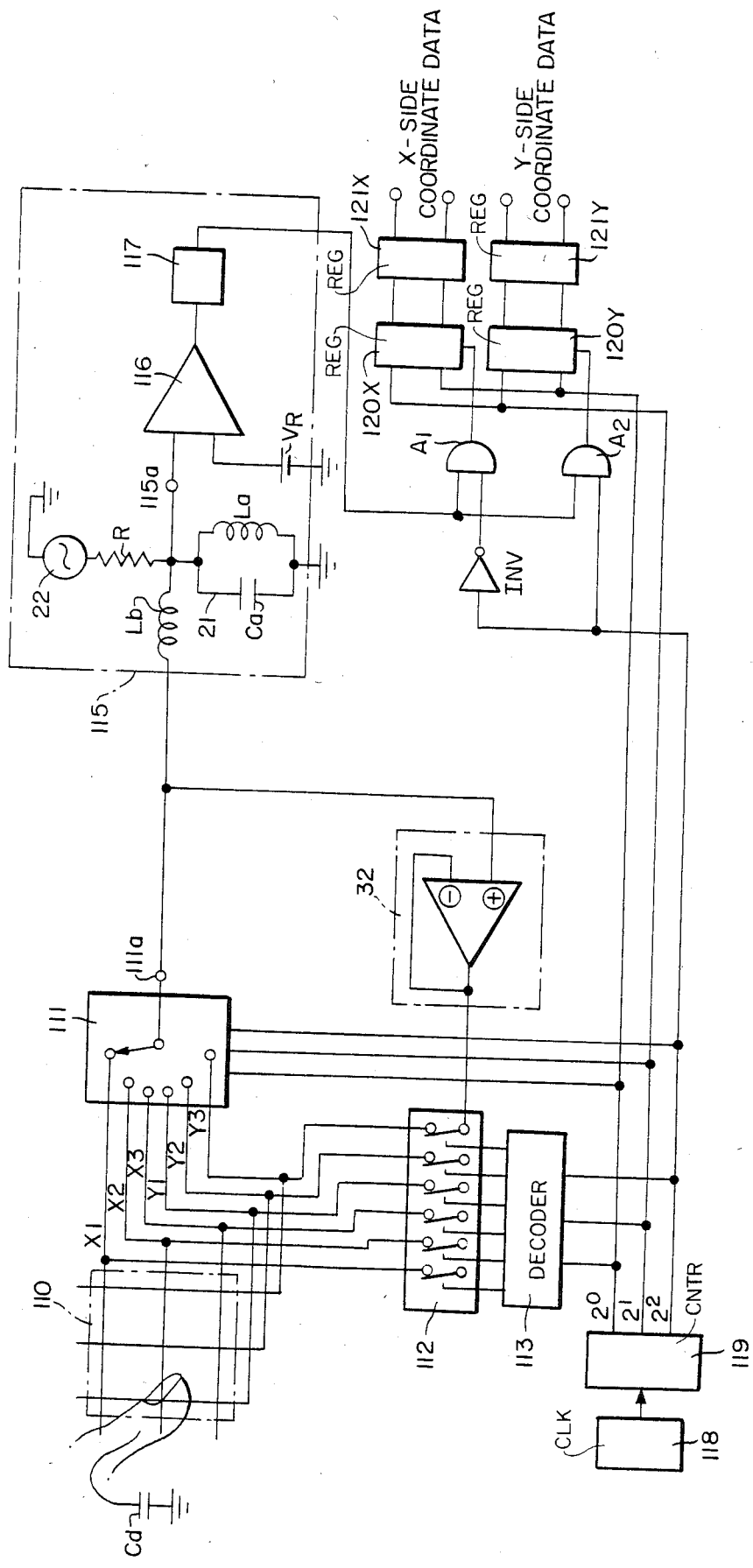
FIG. 2 is a block diagram of a first embodiment of a touch sensing device of the present invention.

FIG. 2 is a block diagram indicating the circuit configuration of a first embodiment of this invention.

A touch panel 110 provides a plurality (for example, a 3×3 matrix of electrodes in the case of this figure) of X and Y sensing electrodes, X1 to X3 and Y1 to Y3 being connected to a multiplexer 111 and an analog switch array 112. An output terminal 111a of the multiplexer 111 is connected to a sensing circuit 115 which includes the parallel/series composite type resonator. An output terminal 115a of the resonator is connected to a comparator 116 which compares the output voltage level at terminal 115a with a reference voltage $V_R$. A smoother circuit 117 smooths the output of the comparator 116. The detecting circuit 115 comprises coils La and Lb, capacitor Ca and resistor R. The capacitor Ca and coil La form the parallel resonator 21, while a capacitor Cd (representing the body capacitance of an operator) and the coil Lb form the series resonator. To this sensing circuit 115, an AC signal of a constant frequency (for example, 12.5 kHz) is supplied by an oscillator 22. The parallel resonator and series resonator are designed to be tuned to the frequency of this oscillator.

The multiplexer 111 is sequentially switched so that only one sensing electrode at a time is connected to the sensing circuit 115, a clock signal generator 118 and a 3-bit counter 119 generate an address signal. The multiplexer 111 which includes a decoder connects the sensing electrodes one by one to the sensing circuit 115 in accordance with the state of address signals from the counter 119.

On the other hand, the address signals from the counter 119 is also input to the decoder 113. The address signals are decoded by the decoder 113 and as a result an analog switch array 112 is controlled. The analog switch array 112 operates to connect all non-selected sensing electrodes to the output of the buffer circuit 32, while the one selected sensing electrode is connected to the sensing circuit 115 through the multiplexer 111. The buffer circuit 32 comprises, as explained previously, a non-inverting type amplifier which provides a voltage gain of about 1 and has high input impedance, and a low output impedance achieved by connecting the minus (−) input terminal of the voltage follower type operational amplifier to the output terminal. The input side of buffer circuit 32 is connected to the common terminal 111a of the multiplexer 111, and thereby the buffer supplies a voltage equivalent to that supplied to the selected touch electrode and in the same phase.

In such a structure, for example, when the touch sensing electrode X1 is selected by the analog multiplexer 111, an AC signal from the oscillator 22 is supplied to the touch sensing electrode X1 through the multiplexer 111. On the other hand, an AC signal from the oscillator 22 is also supplied to all of the non-selected touch sensing electrodes $X_2$ to $Y_3$, except for the touch sensing electrode X1, through the buffer circuit 32. Because the buffer circuit 32 comprises a non-inverting type amplifier which provides a voltage gain of about 1 the AC signal voltage supplied to the touch sensing electrode X1 and the AC signal voltage supplied to the non-selected touch sensing electrodes $X_2$–$Y_3$ have the same phase and voltage. Namely, the voltage of the non-selected touch sensing electrodes $X_2$, $X_3$, and $Y_1$–$Y_3$ follows the voltage of the selected touch sensing electrode $X_1$ in the same phase and level. As a result, almost no current flows between the touch sensing electrode $X_1$ and non-selected touch sensing electrode, and accordingly an impedance between the selected touch sensing electrode $X_1$ and other non-selected touch sensing electrodes can be substantially neglected. Further, when the touch sensing electrodes other than the touch sensing electrode $X_1$ are connected sequentially and selectively to the resonator 21 by the multiplexer 111, the impedance between the sequentially selected touch sensing electrodes and the non-selected touch sensing electrodes can be substantially negligible as explained above.

Since the input impedance of the buffer circuit 32 is sufficient by higher than the resonant impedance of the resonator 21, a change in the electrostatic capacitance of the touch sensing electrodes when a particular area of the touch panel 110 is touched or approached by a finger can be sensed, without any problem, as a change of voltage at the connecting point of the impedance element R and resonator 21. Moreover, since the output impedance of the buffer circuit 32 is almost zero when the touch sensing electrodes corresponding to the touched area is in the non-selected condition, via the analog multiplexer 111, the AC signal voltage to be supplied to the touch sensing electrode is exactly the same as an AC signal voltage supplied to the other touch sensing electrodes. As a buffer circuit 32, an integrated circuit such as an operational amplifier which is commercially available (e.g., LM-310) may be used. This amplifier circuit has an input impedance of about $10^{12}$ ohms and an output impedance of about 0.75 ohm, and provides a voltage gain of about 0.999 at a frequency of 10 kHz.

The output of comparator 116 is connected through the smoothing circuit 117 to one input terminal of a pair of AND gates A1 and A2. The AND gate A1 outputs a touch signal for the X sensing electrodes when the signal obtained by inverting an address signal via the inverter INV matches the sensed signal. The other AND gate A2 outputs, in the same way, the touch signal for the Y sensing electrodes. The output signals of these AND gates A1 and A2 are respectively applied to registers 120X and 120Y, and stored therein as the address signal at the time when the touch signals are generated. The data stored in the registers 120X and 120Y is read by the output registers 121X and 121Y when the scanning of the one cycle (period) for the X and Y sensing electrodes is completed, and is then sent to a computer as address information indicating the finger-touch electrode location.

Figure 3:
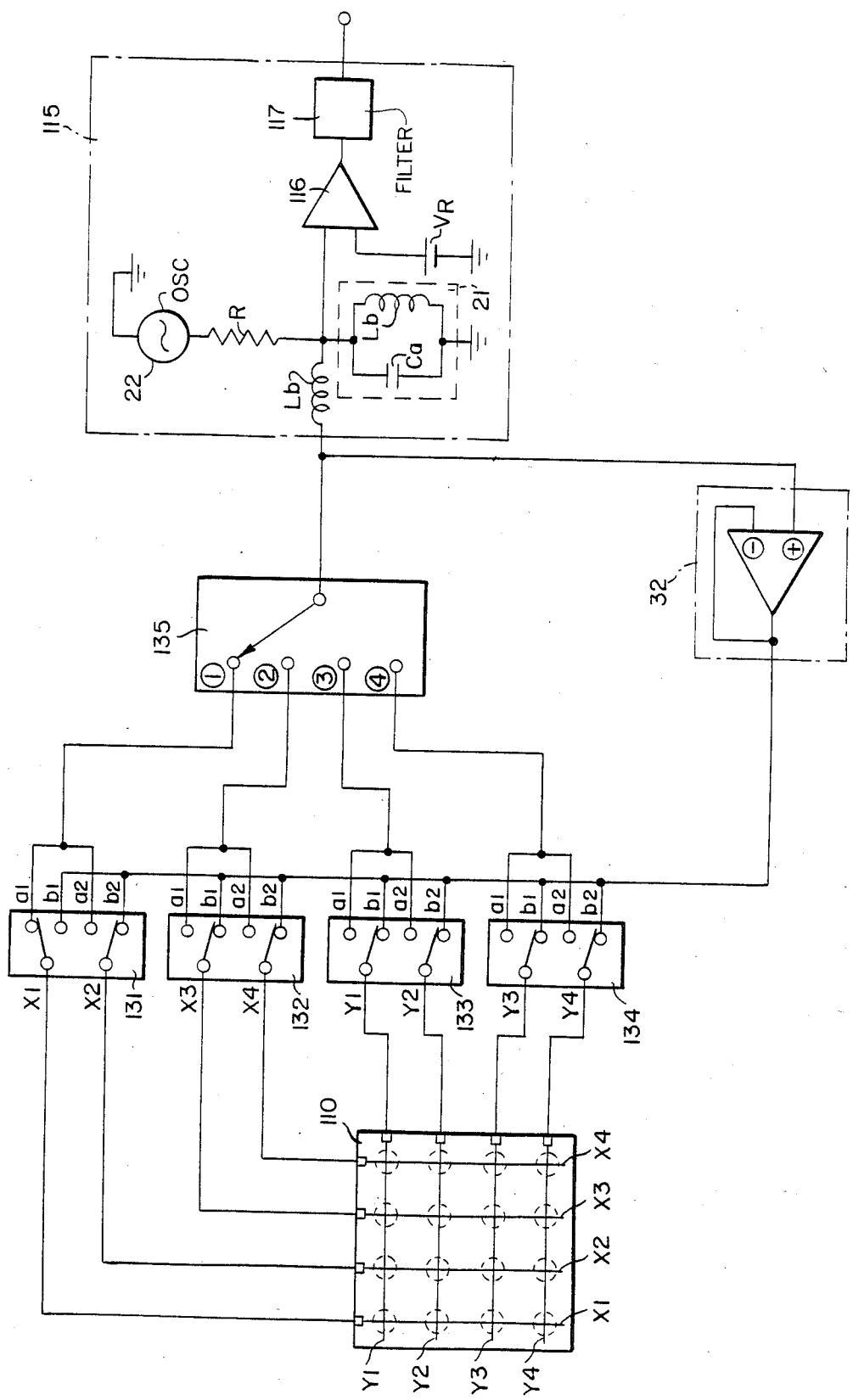
FIG. 3 is a block diagram indicating a second embodiment of the present invention.

FIG. 3 shows another embodiment of the present invention, and the which are the same as those in FIG. 2 are given the same reference numerals. In FIG. 3, the touch panel 110 provides eight touch sensing electrodes $X_1$–$X_4$ and $Y_1$–$Y_4$ which are respectively divided into two blocks of two. The electrodes are connected to four analog switches 131–134. Each analog switch has two pairs of input terminals a1, a2, and b1, b2. Each pair of terminals $a_1$, $a_2$ is respectively connected in common to a corresponding one the four output terminals 1–4 of an analog multiplexer 135. The output of multiplexer 135 is connected to the sensing circuit 115. In addition, each of the other pairs of input terminals b1, b2 of the analog switch is connected in common to the output of buffer circuit 32. Namely, in the example of FIG. 3, connection of selected touch electrode to the sensing circuit and connection of non-selected touch electrode to the buffer circuit is performed through the common analog switches 131–134. In this case, if eight a1 side input terminals of each analog switches 131–134 are connected in common, the analog multiplexer may theoretically be omitted. However, when the number of electrodes to be selected increases, such common connection brings about the addition of unwanted floating capacitance to the selected touch electrodes and a resultant drop of detection sensitivity may be caused. Therefore, as described above, it is very effective for preventing a drop in the detecting sensitivity to provide an analog multiplexer 135 which switches the sensing circuits corresponding to a plurality of electrode blocks by grouping the touch sensing electrodes.

As will be understood from above description, according to this invention, inter-electrode capacitance of touch sensing electrodes and erroneous operation due to moisture and contamination can be eliminated. Accordingly, this invention is very effective in providing a highly sensitive and reliable tough sensing device included in a large size touch panel.

I claim:

1. A touch sensing device having a plurality of touch sensing electrodes defining positions to be sensed and having an impedance between corresponding ones of the electrodes, said device comprising:
    a touch sensing circuit to which said touch sensing electrodes are sequentially and selectively connected, said touch sensing circuit including-
    an oscillator for supplying an AC signal to said selected touch sensing electrode; and
    a buffer circuit means for isolating the AC signal from the selected touch electrode and for supplying the AC signal to the non-selected touch sensing electrodes, so that the non-selected touch sensing electrodes are clamped to substantially the same potential as that of the selected electrodes and an impedance between the adjacent touch electrodes is negligible.

2. A touch sensing device according to claim (1), wherein said buffer circuit means comprises a non-inverting type amplifier having a voltage gain of about 1, a high input impedance and a low output impedance.

3. A touch sensing device for a touch keyboard having electrodes arranged to define key positions, each electrode having a selected and a non-selected state, said device comprising:
    oscillator means for generating an AC signal;
    selection means, operatively connected to said oscillator means, for placing in the selected state, desired ones of the electrodes and for applying said AC signal to said selected electrodes; and
    buffer means, operatively connected to said oscillator means and to said selection means, for amplifying said AC signal and for providing said amplified signal to the non-selected electrodes.

4. A touch sensing device according to claim 3, wherein said selection means includes:
    clock means for providing address signals;
    first switching means for connecting said selected ones of the electrodes to the oscillator means in response to the address signals; and
    second switching means for connecting the non-selected ones of the electrodes to said buffer means in response to the address signals.

5. A touch sensing device according to claim 3, wherein said selection means includes:
    first switching means, having a plurality of outputs, operatively connected to said oscillator means, for selectively applying said AC signal to said plurality of outputs; and
    second switching means having a first set of inputs operatively connected to said buffer means, and a second set of inputs each being operatively connected to a corresponding one of said plurality of outputs of said first switching means, for applying said AC signal to one of the electrodes and for applying said amplified signal to non-selected electrodes.

* * * * *